United States Patent
Djurdjevic et al.

(10) Patent No.: US 10,263,640 B2
(45) Date of Patent: Apr. 16, 2019

(54) LOW DENSITY PARITY CHECK (LDPC) DECODER WITH PRE-SATURATION COMPENSATION

(71) Applicant: Seagate Technology LLC, Cupertino, CA (US)

(72) Inventors: Ivana Djurdjevic, San Joe, CA (US); Ara Patapoutian, Hopkinton, MA (US); Zheng Wang, Louisville, CO (US); AbdelHakim Alhussien, San Jose, CA (US); Sundararajan Sankaranarayanan, Fremont, CA (US); Ludovic Danjean, San Jose, CA (US); Erich F. Haratsch, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 87 days.

(21) Appl. No.: 15/478,895

(22) Filed: Apr. 4, 2017

(65) Prior Publication Data
US 2018/0287635 A1 Oct. 4, 2018

(51) Int. Cl.
*H03M 13/11* (2006.01)
(52) U.S. Cl.
CPC ............... *H03M 13/1111* (2013.01)
(58) Field of Classification Search
None
See application file for complete search history.

(56) References Cited

U.S. PATENT DOCUMENTS

| | | |
|---|---|---|
| 7,191,378 B2 | 3/2007 | Eroz et al. |
| 7,562,279 B2 | 7/2009 | Zhang et al. |
| 7,911,364 B1 | 3/2011 | Zhang et al. |
| 7,934,139 B2 | 4/2011 | Andreev et al. |
| 8,201,051 B2 | 6/2012 | Tan et al. |

(Continued)

OTHER PUBLICATIONS

N. Kanistras, I. Tsatsaragkos, I. Paraskevakos, A. Mahdi and V. Paliouras, "Impact of LLR saturation and quantization on LDPC min-sum decoders," 2010 IEEE Workshop On Signal Processing Systems, San Francisco, CA, 2010, pp. 410-415.*

(Continued)

*Primary Examiner* — Steve N Nguyen
(74) *Attorney, Agent, or Firm* — Hall Estill Attorneys at Law (57) ABSTRACT

Method and apparatus for decoding data. In some embodiments, an LDPC decoder has a variable node circuit (VNC) with a plurality of variable nodes configured to store bit reliability values of m-bit code bits. A check node circuit (CNC) has a plurality of check nodes configured to perform parity check operations upon n-bit messages from the VNC. Each n-bit message is formed from a combination of the bit reliability values and stored messages from the check nodes. A pre-saturation compensation circuit is configured to maintain a magnitude of each n-bit message received by the CNC below a saturation limit comprising the maximum value that can be expressed using p bits, with p less than n and each of the n-bit messages received by the CNC having a different magnitude. The pre-saturation compensation circuit may apply different scaling and/or bias factors to the n-bit messages over different decoding iterations.

19 Claims, 7 Drawing Sheets

(56) References Cited

U.S. PATENT DOCUMENTS

| | | | |
|---|---|---|---|
| 8,484,531 B1 | 7/2013 | Varnica et al. | |
| 8,543,883 B2 | 9/2013 | Chen et al. | |
| 8,566,665 B2 | 10/2013 | Li | |
| 8,650,451 B2 | 2/2014 | Krishnan et al. | |
| 8,656,249 B2 | 2/2014 | Chen et al. | |
| 8,709,863 B2 | 4/2014 | Varnica et al. | |
| 8,769,382 B1 | 7/2014 | Varnica et al. | |
| 8,862,961 B2 | 10/2014 | Zhang et al. | |
| 8,879,640 B2 | 11/2014 | Chow et al. | |
| 8,930,788 B2 | 1/2015 | Zhang et al. | |
| 9,015,547 B2 | 4/2015 | Wang et al. | |
| 9,048,870 B2 | 6/2015 | Li et al. | |
| 9,059,742 B1* | 6/2015 | Anderson | G06F 11/1068 |
| 9,256,487 B1* | 2/2016 | Varnica | H03M 13/1114 |
| 9,473,175 B1* | 10/2016 | Graumann | H03M 13/1111 |
| 2010/0042903 A1* | 2/2010 | Gunnam | H03M 13/1111 714/780 |
| 2010/0269016 A1* | 10/2010 | Ware | G11C 11/5621 714/763 |
| 2012/0221914 A1* | 8/2012 | Morero | H03M 13/015 714/752 |
| 2013/0061114 A1* | 3/2013 | Malmirchegini | H03M 13/1117 714/763 |
| 2013/0212447 A1* | 8/2013 | Li | H03M 13/6343 714/763 |
| 2014/0053037 A1* | 2/2014 | Wang | H03M 13/13 714/752 |
| 2014/0089757 A1 | 3/2014 | Yang et al. | |
| 2014/0143628 A1* | 5/2014 | Li | H03M 13/6591 714/752 |
| 2015/0372695 A1 | 12/2015 | Li et al. | |
| 2016/0191079 A1* | 6/2016 | Zuo | H03M 13/1117 714/752 |
| 2017/0026055 A1* | 1/2017 | Wu | H03M 13/112 |

OTHER PUBLICATIONS

Ahmed A. Emran and Maha Elsabrouty, "Generalized Simplified Variable-Scaled Min Sum LDPC decoder for irregular LDPC Codes," Electronics and Electrical Communications, 5 pps., Egypt-Japan University for Science and Technology, Alexandria, Egypt.

Ahmed A. Emran and Maha Elsabrouty, "Simplified Variable-Scaled Min Sum LDPC decoder for irregular LDPC Codes," Electronics and Communications Engineering Department, 6 pps., Egypt-Japan University for Science and Technology, Alexandria, Egypt.

Kiran K. Gunnam, Gwan S. Choi, Weihuang Wang and Mark B. Yeary, "A Parallel VLSI Architecture for Layered Decoding," pp. 1-54.

Ahmed A. Hamad, "Estimation of Two-Dimensional Correction Factors for Min-Sum Decoding of Regular LDPC Code," Wireless Engineering and Technology, 2013, pp. 181-187, 4, Scientific Research.

Yongmin Jung, Yunho Jung, Seongjoo Lee and Jaeseck Kim, "New Min-Sum LDPC Decoding Algorithm Using SNR-Considered Adaptive Scaling Factors," ETRI Journal, Aug. 2014, pp. 591-598, vol. 36, No. 4.

Marjan Karkooti, Predrag Radosavljevic and Joseph R. Cavallaro, "Configurable, High Throughput, Irregular LDPC Decoder Architecture: Tradeoff Analysis and Implementation," Department of Electrical and Computer Engineering, Rice University, 8 pps., Houston, Texas.

Tom Richardson, "Error Floors of LDPC Codes," pp. 1426-1435, Flarion Technologies, Bedminster, Jer Jersey.

Geo Niju Shanth and Saru Priya, "Low Complexity Implementation of LDPC Decoder Using MIN-Sum Algorithm," International Journal of Computer Applications, 2013, International Conference on Innovations in Intelligent Instrumentation, Optimization and Signal Processing, Velammal Engineering College, Chennai.

Juntan Zhang, Marc Fossorier, Daqing Gu, and Jinyun Zhang, Improved Min-Sum Decoding of LDPC Codes Using 2-Dimensional Normalization, Mitsubishi Electric Research Laboratories, Inc., Jun. 2006, 7 pps., Cambridge, Massachusetts.

Juntan Zhang, Marc Fossorier, Daqing Gu, and Jinyun Zhang, "Two-Dimensional Correction for Min-Sum Decoding of Irregular LDPC Codes," Mitsubishi Electric Research Laboratories, Inc., Jun. 2006, 4 pps., Cambridge, Massachusetts.

Zhengya Zhang, Lara Dolecek, Martin Wainwright, Venkat Anantharam and Borivoje Nikolic, "Quantization effects in Low-Density Parity-Check Decoders," IEEE, 2007, pp. 6231-6237.

Xiaojie Zhang and Paul H. Siegel, "Quantized Min-Sum Decoders with Low Error Floor for LDPC Codes," IEEE, 2012, pp. 2871-2875.

Hao Zhong, Wei Xu, Ningde Xie and Tong Zhang, "Area-Efficient Min-Sum Decoder Design for High-Rate QC-LDPC Codes in Magnetic Recording," 2007.

* cited by examiner

LOG-LIKELIHOOD RATIO LOOK UP TABLE (LLR LUT)

| INPUT v2c MESSAGE MAGNITUDE | 0 | 1 | 2 | 3 | 4 | 5 | 6 | 7 | 8 | 9 | 10 | 11 | 12 | >12 |
|---|---|---|---|---|---|---|---|---|---|---|---|---|---|---|
| OUTPUT SCALED v2c MESSAGE MAGNITUDE (Sv2c) | 0 | 1 | 1 | 2 | 2 | 3 | 3 | 4 | 4 | 5 | 5 | 6 | 6 | 7 |

SSD STORAGE DEVICE

FIG. 14

HDD/HYBRID STORAGE DEVICE

FIG. 15

LOW DENSITY PARITY CHECK (LDPC) DECODER WITH PRE-SATURATION COMPENSATION

SUMMARY

Various embodiments disclosed herein are generally directed to decoding data in a data channel using a low density parity check (LDPC) decoder.

In some embodiments, the LDPC decoder has a variable node circuit (VNC) with a plurality of variable nodes configured to generate bit reliability (likelihood) values of an m-bit input code word. A check node circuit (CNC) has a plurality of check nodes configured to perform parity check operations upon n-bit messages from the VNC. Each n-bit message formed from a combination of a bit reliability value and a stored message from a subset of the check nodes. A pre-saturation compensation circuit is configured to maintain a magnitude of an n-bit message received by the CNC below a saturation limit comprising the maximum value that can be expressed using p bits (p<n), with each of the p-bit messages received by the CNC having a different magnitude.

These and other features and advantages which may characterize various embodiments can be understood in view of the following detailed discussion and the accompanying drawings.

DETAILED DESCRIPTION

The present disclosure generally relates to the decoding of data in a data channel using a low density parity check (LDPC) decoder.

LDPC codes are linear error correcting block codes that are useful in the transmission of data. LDPC codes take the form of code words having both an informational component (e.g., user data bits) and overhead or redundant bits for error correction. A common convention is to describe LDPC code words as k/n codes, where n represents the total number of bits, k represents the number of user bits, and n-k represents the number of redundant bits.

A number of industry standards have been enacted to facilitate LDPC code transmissions over wireless and wired interfaces. Because LDPC codes have a robust ability to handle high speed transmission of data in a noisy environment at or near the theoretical capacity of the transmission capability of the interface, LDPC codes are often used in high data I/O communication channels, including but not limited to data storage devices such as solid state drives (SSDs), hard disc drives (HDDs), hybrid solid state drives (HSSDs), etc.

An LDPC decoder is a type of circuit used to decode LDPC codes. An LDPC decoder often employs a number of variable node units (VNUs) and check node units (CNUs). The VNUs generate individual code bit reliabilities. The CNUs perform parity checks upon different combinations of the contents of the VNUs using combinatorial logic functions and generate additional soft information that is stored in the memory and used by the VNUs in subsequent processing.

An input code word is successfully decoded if all the parity constraints of the CNUs are met. If one or more errors are detected, subsequent iterations are carried out, including through the use of soft information that gives further information regarding the state of the code word. Each iteration involves messages being sent between the various units. Messages from the VNUs to the CNUs may be referred to as v2c or r messages, and messages from the CNUs to the VNUs may be referred to as c2v or q messages. Other notations may be used, such as P and Q messages, etc.

There are a number of different LDPC approaches, or algorithms. One well known algorithm is the belief propagation algorithm. This provides efficient operation but requires great circuit complexity. A min-sum LDPC approach (min-sum algorithm) is used to simplify hardware requirements but introduces probability testing to help approximate belief propagation levels of performance. LLR (log-likelihood ratio) values are usually generated during a min-sum LDPC decoding operation and serve as null/alternate test hypotheses as different combinations of bits are tried. A high LLR magnitude for a given variable node indicates that the existing bit value (e.g., a 0 or 1) in the node is very likely to be the correct value, while a low LLR magnitude indicates that the existing bit value in the node is not very likely to be the correct one.

Operational performance of an LDPC decoder is highly dependent on channel noise. A graph of observed bit error rate (BER) to signal to noise ratio (SNR) shows a steep improvement in BER as noise in the channel is reduced. This is sometimes referred to as a waterfall region and exhibits an exponential slope. At very low levels of noise, the response of the LDPC decoder flattens out to form a so-called error floor, which is a shoulder portion of the graph that exhibits a very shallow slope. One reason for the change in slope at the error floor is that, as the number of errors present decreases to a very small value, it can become increasingly difficult to resolve the remaining errors, particularly for certain bit error combinations (trapping sets) that involve bit symmetries that can resist easy resolution.

In a min-sum LDPC environment, a v2c message is generated by adding a number of c2v messages and an associated input LLR value. Because there is finite maximum precision available in the sizes of the messages that can be transferred, there is a possibility that v2c messages may become saturated before reaching the associated CNU. In this context, saturated or saturation generally describes a situation where the magnitude of an iterated v2c message has reached the maximum limit based on the number of bits available to describe the message. More particularly, if the v2c messages have a maximum length of n bits, then a v2c message with all logical 1s would have reached its maximum value, and further increases in the magnitude of the message could not be communicated because such would result in a buffer overflow or other related condition.

The tendency for v2c messages to easily reach saturation undesirably raises the error floor response of the decoder. In the error floor region of operation, channel LLR values will tend to be large, and so all messages will tend to be large as well and will grow quickly in the decoder. Once saturated, the CNU cannot easily differentiate between these messages and resolve the error condition.

Accordingly, various embodiments of the present disclosure are directed to an apparatus and method for applying pre-saturation compensation to a min-sum LDPC decoder. As explained below, some embodiments generally provide the decoder with a variable node circuit (VNC) and a check node circuit (CNC). The VNC has a number of variable nodes configured to generate code bit reliabilities. The CNC has a number of check nodes connected to selected groups of the variable nodes and is provided with parity checking capabilities. The VNC forms and transfers messages to each check node in the CNC based on a combination of the bit reliabilities of the variable nodes connected to the check node (e.g., v2c messages).

A pre-saturation compensation circuit operates upon the v2c messages to prevent most of the messages from becoming saturated, or reaching a maximum available magnitude based on the number of available bits in the message. The pre-saturation compensation can take a variety of forms.

In some embodiments, the pre-saturation compensation is achieved by using scaling factors which are combined with the messages. In other embodiments, biasing factors are combined with the messages. In further embodiments, a look-up table (LUT) can be used to achieve pre-saturation compensation. Since all the messages represent some form of bit log-likelihood ratio (LLR), this LLR is referred to as an LLR LUT. In other embodiments, input LLR values are reduced which reduces the overall magnitude of the LLR values prior to processing by the VNU and prevents saturation of a portion of the messages. These approaches can be applied individually or in combination as required. In still further embodiments, scaling/biasing factors and/or LLR LUT values can be similarly applied to messages that are returned from the CNU to the VNU.

It has been found that these techniques can result in better performance in both the waterfall region and the error floor region of the LDPC decoder response. The technique adds relatively little additional complexity and can be readily adapted to a number of different applications and environments.

Figure 1:
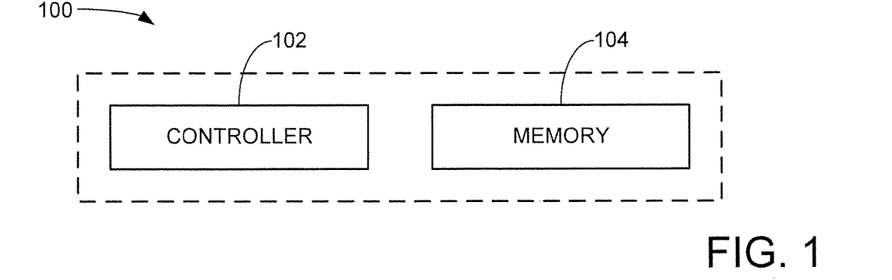
FIG. 1 provides a functional block representation of a data storage device to provide an exemplary operational environment for various embodiments of the present disclosure.

These and other features and aspects of various embodiments will be understood beginning with a review of FIG. 1 which generally illustrates an exemplary data storage device 100. The device 100 is presented to provide an exemplary environment in which the various embodiments may be advantageously practiced. The various embodiments set forth herein are not limited to data storage applications and can readily be extended to substantially any other data transmission channel that uses LDPC algorithms.

The device 100 includes a controller 102 and a memory module 104. The controller 102 provides top level control for the device 100 and may be configured as a programmable processor with associated programming in local memory. Additionally or alternatively, the controller may take the form of a hardware based control circuit with logic gates or other elements to carry out the required controller functions.

The memory module 104 can be arranged as one or more non-volatile memory elements including rotatable recording discs and solid-state memory arrays. While a separate controller 102 is shown in FIG. 1, such is unnecessary as alternative embodiments may incorporate any requisite controller functions directly into the memory module, or external to the data storage device. While not limiting, for purposes of the present discussion it will be contemplated that the data storage device 100 is a solid-state drive (SSD) that utilizes NAND flash memory to store and retrieve user data from a host device.

Figure 2:
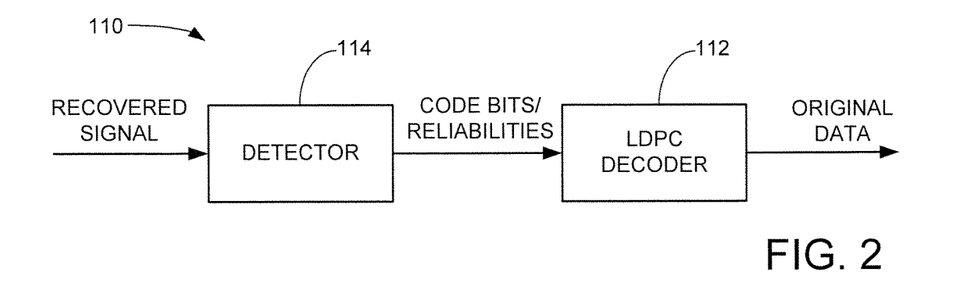
FIG. 2 is a schematic depiction of a data recovery channel that uses a low density parity check (LDPC) decoder to decode data in accordance with some embodiments of the present disclosure.

FIG. 2 provides a schematic depiction of a portion of a data recovery channel 110 that uses a low density parity check (LDPC) decoder 112 to decode data in accordance with some embodiments. The channel 110 may form a portion of the data storage device 100 of FIG. 1.

In essence, the LDPC decoder 112 receives input code bits and their reliabilities, and determines if there are any bit errors present in the received code bits. If so, the LDPC decoder 112 operates in an iterative fashion to identify and correct the bit errors so that a corrected code word can be output for further processing.

In FIG. 2, upstream processing is applied to an input (recovered) communication signal by a detector 114. Processing steps by or prior to the detector 114 can take a variety of forms, including an analog front end, digitalization, maximum likelihood detection, etc.

The detector 114 outputs a sequence of code bits and bit reliabilities, e.g., LLR values, based on multiple reads from the storage media. Each code word has an informational component and a redundant (overhead) component and consists of a number of bits (e.g., m bits). Code words of any suitable length can be used based on the architecture of the system. Code words having thousands of bits or more (m>>1000) are commonly employed in many data storage device applications.

The LDPC decoder 112 applies a specially configured min-sum LDPC algorithm to the input code bit reliabilities to output the original data (e.g., the informational content of the recovered signal). The LDPC decoder 112 and the detector 114 can be realized in hardware, software and/or firmware using any number of hardwired and/or programmable circuit configurations. Furthermore, the decoder 112 and detector 114 can exchange soft bit reliability information in an iterative fashion.

Figure 3:
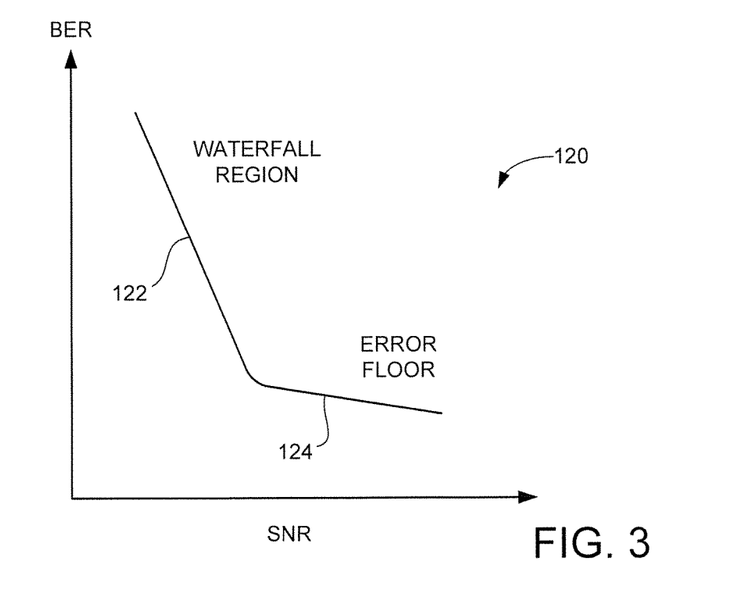
FIG. 3 is a graphical representation of an error rate response characteristic of the LDPC decoder of FIG. 2.

FIG. 3 is a graphical representation of an error rate response curve 120 to generally describe error rate performance of the LDPC decoder 112 from FIG. 2. Curves such as 120 can be described in a variety of ways; in FIG. 3, the curve 120 is plotted against a measured code word bit error rate (BER) y-axis and an observed signal to noise ratio (SNR) x-axis. The convention of FIG. 3 indicates better overall error rate performance lower down along the y-axis toward the origin, and better overall signal performance (e.g., less noise) along the x-axis away from the origin. For reference, the curve can be plotted against a raw bit error rate (RBER) x-axis instead of an SNR x-axis, and this would provide the curve with a similar overall shape and would be horizontally flipped, e.g., rotated about the y-axis by 180 degrees.

The curve 120 is shown to have two main regions or portions: a waterfall region 122 and an error floor 124. As will be recognized, the waterfall region 122 has a relatively steep slope and indicates significant improvements in error rate performance with reductions in channel noise, at least up to a point at which the error floor region 124 dominates.

The error floor 124 has a significantly reduced slope, indicating that, with continued improvements in SNR (reductions in noise), a lower limit is achieved with respect to optimum BER. The change in slope also suggests that as the channel becomes less noisy, it may become significantly more difficult for the LDPC decoder 112 to resolve code words, particularly in certain circumstances. For example, trapping sets are bit error combinations that become "trapped" within the iterations of the LDPC algorithm and are not easily resolved.

Figure 4:
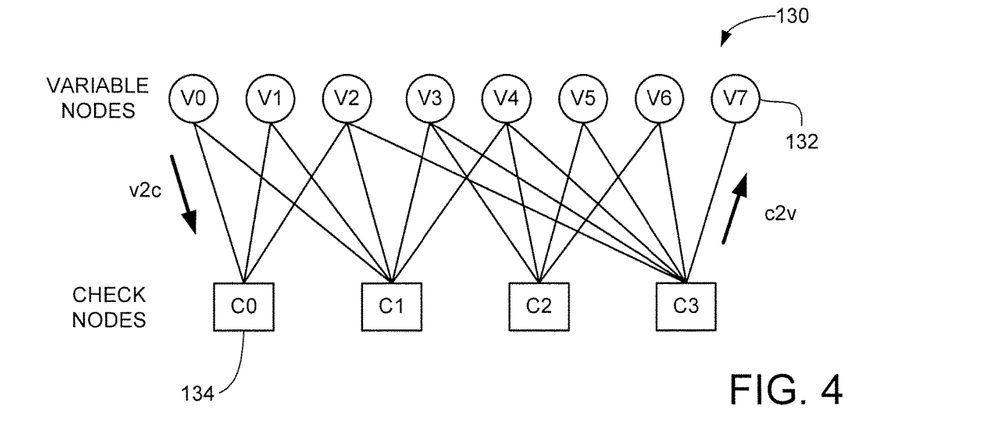
FIG. 4 is an interconnection diagram illustrating aspects of the LDPC decoder.

FIG. 4 provides a Tanner diagram 130 to illustrate aspects of the LDPC decoder 112 of FIG. 2 in some embodiments. The decoder includes a number of variable node units (VNUs) 132, also referred to as variable nodes. A total of eight (8) variable nodes 132 are shown in FIG. 4, labeled as V0-V7.

The variable nodes 132 communicate with a series of check node units (CNUs) or check nodes 134. A total of four check nodes are shown, labeled as C0-C3. Other respective numbers and arrangements of the respective nodes 132, 134 can be provided as desired.

Input code bit reliabilities are initially loaded to the variable nodes 132, with a single bit log-likelihood ratio (LLR) supplied in each variable node. The bit LLR values in the variable nodes are selectively combined to form v2c messages that are transferred to the corresponding check nodes 134. In FIG. 4, check node C0 receives bits from variable nodes V0, V1 and V2; check node C3 receives bits from variable nodes V2 through V7, and so on.

Once received, the v2c messages are evaluated by the check nodes using certain parity constraints to resolve the code word. In one example, the check nodes 134 may implement an even parity constraint so that all of the bits in a given v2c message should sum up to a 0 (even) value. Other parity constraints can be used.

Messages with these parity computational results are returned in the form of c2v messages. Generally, each iteration of the LDPC algorithm includes the generation and transfer of one set of v2c messages to the check nodes, followed by the return of one set of c2v messages to the variable nodes. If no errors are present, the resulting code word is resolved and the data are output as shown in FIG. 2. If at least one error is present, the values of the variable nodes 132 are updated using the c2v messages and, in some cases, other information. Subsequent iterations may be applied in an effort to resolve the code word.

The computation of the v2c messages from the i-th variable node to the j-th variable check node in FIG. 4 can be expressed as follows:

$$q_{i \to j} = LLR_i + \sum_{j' \in N(j) \setminus i} r_{j' \to i} \quad (1)$$

where $LLR_i$ is the channel log-likelihood ratio corresponding to the i-th variable node, and $r_{ji}$ represents the c2v message from the j-th check node to the i-th variable node.

LLR values are multi-bit estimates of probability of a two state null-hypothesis regarding the existing state of the associated variable nodes. The higher the magnitude of the $LLR_i$ value, the more likely it is that the existing bit state (0 or 1) of the i-th variable node is the correct value. The lower the magnitude of the $LLR_i$ value, the more likely it is that the alternate bit value (1 or 0) is the correct state.

Equation (1) shows that each v2c message includes an informational content of previous messages, as well as soft information that can provide further clues to aid in the decoding of the code word. In some cases, the check nodes can use the information provided by the overall magnitude of the v2c message to make adjustments to the contents in the variable nodes.

The corresponding c2v messages from the j-th check node to the i-th variable node can be expressed as follows:

$$r_{j \to i} = \prod_{i' \in N(j) \setminus i} \text{sign}(q_{i' \to j}) \cdot \min_{i' \in N(j) \setminus i} |q_{i' \to j}| \quad (2)$$

The LDPC decoder 112 implements a min-sum algorithm which approximates the more computationally complex belief propagation algorithm while using simplified hardware/software. One limitation of the min-sum algorithm is degraded waterfall performance as compared to that available using a pure belief propagation approach, so that the min-sum algorithm provides worse code word failure rates at the same raw bit error rate (RBER).

Another limitation with the min-sum algorithm is the finite precision available in the respective v2c and c2v messages. As noted above, a practical result of this finite precision is that there is a maximum magnitude that can be achieved in the size of the v2c messages. Whether implemented in software or hardware, there will generally be a maximum total of n bits available to describe the respective v2c and c2v messages. Values such as n=4 bits, n=8 bits, etc., may be more suitable for hardware decoder based implementations. Higher values, such as n=32, n=64, etc., may be more suitable for software based implementations. As will be appreciated, the various embodiments disclosed herein are suitable for both types of implementations.

The $q_{ij}$ values can grow very large, causing the v2c messages to achieve saturation, which as described above is a situation where the maximum available value has been reached (e.g., a v2c message of n bits in length where each n bit value is a logical 1). From equations (1) and (2), it can be seen that, in some cases, saturation may be achieved in just a few iterations of the LDPC decoder.

Figure 5:
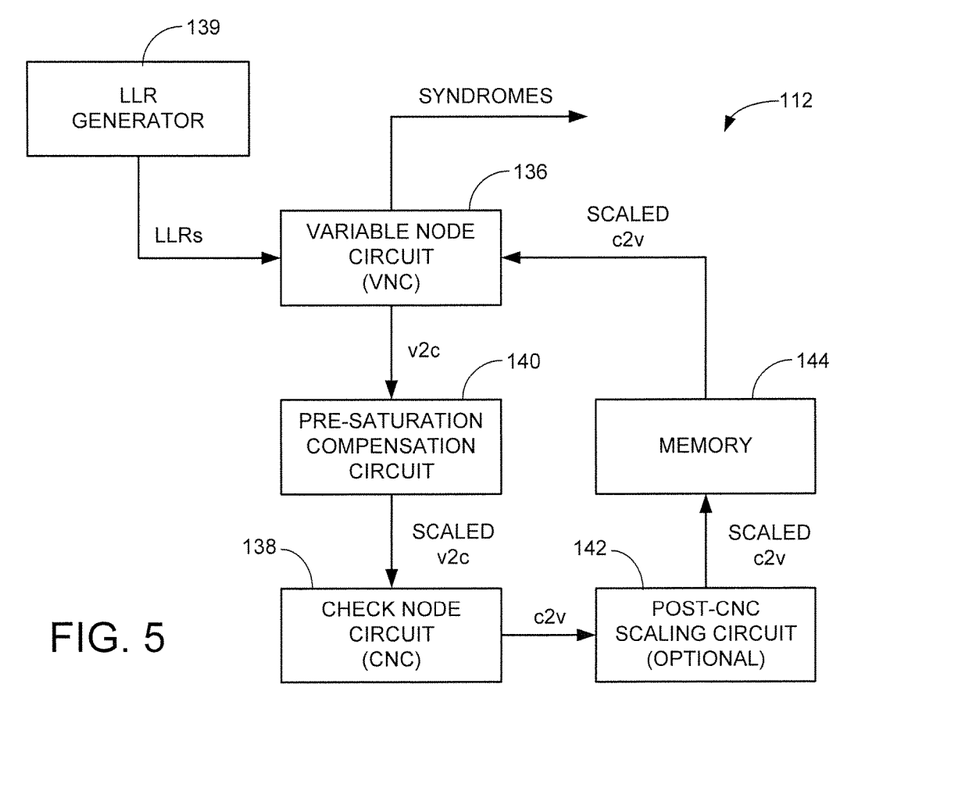
FIG. 5 is a functional block representation of the LDPC decoder in accordance with some embodiments.

FIG. 5 shows a block diagram representation of the LDPC decoder 112 configured to address these and other limitations with the existing art. The variable nodes 132 and check nodes 134 from FIG. 4 are collectively incorporated into a variable node circuit (VNC) 136 and check node circuit (CNC) 138, respectively. An LLR generator 139, upstream of the LDPC decoder 112, generates LLRs on a per node basis and feeds the LLRs to the VNC 136.

The VNC 136 operates to combine the bit reliability values received from different check nodes and the LLR generator to form multi-bit v2c message messages. It is contemplated that each v2c message will have a total of n-bits. A pre-saturation compensation circuit 140 operates upon the n-bit v2c messages to produce scaled v2c messages. The scaled v2c messages are p-bit messages where p is less than n (p<n) and which are forwarded to the CNCs 138 as discussed above.

The pre-saturation compensation circuit 140 prevents at least a large portion of the v2c messages from achieving saturation by maintaining the overall magnitude of the v2c messages below the maximum available magnitude that could be expressed by n bits (an n-bit value consisting of n logical 1s is the largest available value that could be expressed by n bits). In some embodiments, the p-bit v2c messages are maintained below the maximum available magnitude that could be expressed by p bits. The scaled v2c messages maintain a useful informational content to facilitate resolution of the bit errors in the code word. A number of different alternative embodiments for the pre-saturation compensation circuit will be discussed in detail below.

In some cases, an optional post-CNC scaling circuit 142 can be used to condition the c2v messages output by the CNCs 138 to provide scaled c2v messages which are temporarily stored in a local memory 144 before transfer to the VNCs 136. It is contemplated that the c2v messages will also be p bits in length. FIG. 5 shows the output of syndromes from the VNC 136 indicating a status of the decoding process; resolution of all syndromes signals successful decoding of the code word.

Figure 6:
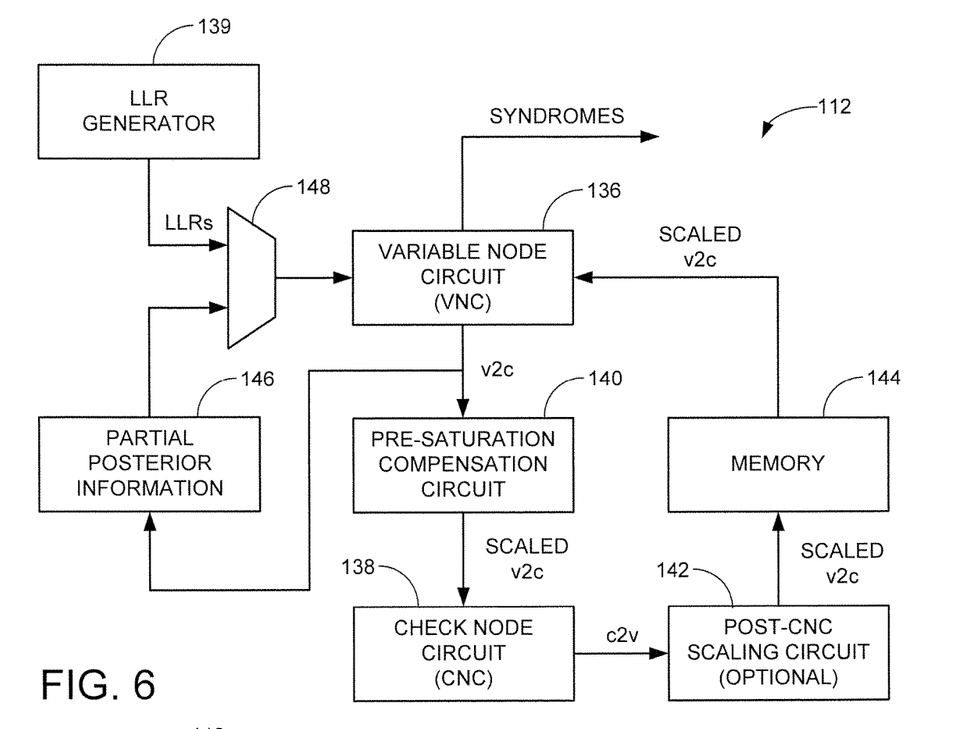
FIG. 6 is a functional block representation of the LDPC decoder in accordance with further embodiments.

FIG. 6 is an alternative configuration for the LDPC decoder 112 in accordance with further embodiments. As before, a pre-saturation compensation circuit 140, optional post-CNC scaling circuit 142 and local memory 144 are supplied to condition messages passed between the VNCs 136 and the CNCs 138.

Partial posterior information is obtained from the originally (unsealed) v2c messages and stored in a local memory 146 pending combination with the scaled c2v messages stored in memory 144 in the next iteration. This arrangement can provide more efficient hardware implementation for many practical LDPC codes.

Figure 7:
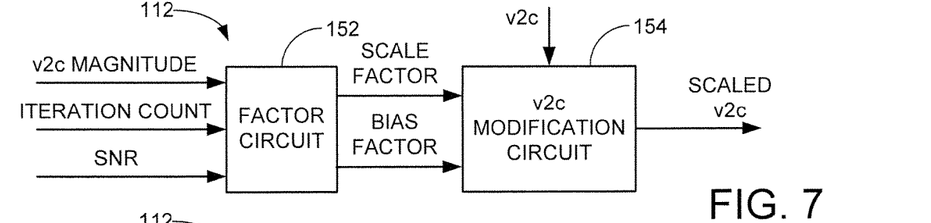
FIG. 7 illustrates an arrangement of the pre-saturation compensation circuit of FIGS. 5-6 in some embodiments.

FIG. 7 shows a block diagram for the pre-saturation compensation circuit 140 from FIGS. 5-6 in accordance with some embodiments. In this case, a factor circuit 152 generates and/or stores one or more factors which are supplied to a v2c modification circuit 154 to generate the scaled v2c ("Sv2c") messages. Generally, a scale factor (S) may operate as a scalar quantity that is combined with a calculated v2c to provide the scaled v2c value, such as follows:

$$Sv2c = \text{round}[(S)(v2c)] \quad (3)$$

A bias factor (B) may be utilized as a bias, or weighting value, to a particular term within the v2c calculation, such as:

$$Sv2c = \text{round}(v2c+B) \quad (4)$$

Both scaling factors and bias factors may be utilized at the same time, such as:

$$Sv2c = \text{round}[(S)(v2c+B)] \quad (5)$$

The scaling factors S and bias factors B may be applied in any suitable manner to maintain at least a large part of the v2c magnitudes below saturation. Suitable scaling factors S and bias factors B can be obtained using empirical and/or adaptive methods. In the above example, both S and B are contemplated as being values of from 0 to 1. Other arrangements can be used, so long as the scaling and/or bias factors tend to reduce the overall magnitude of the Sv2c messages to reduce reaching the saturation limit.

The factor circuit 152 may monitor certain process parameters, such as v2c magnitude, iteration count in a given decoding sequence, SNR, etc. to switch in and apply various scaling and/or bias factors. In at least some embodiments, different scaling factors and/or bias factors are applied at different iterations within a given LDPC decoding operation; a first set of factors may be applied during a first iteration, a different, second set of factors may be applied during a second iteration, and so on.

The circuit arrangement of FIG. 7 can also be used to implement the post-CNC scaling circuit 142 to provide scaled c2v messages, as discussed above in FIGS. 5-6. It is contemplated that different scaling and/or bias factors may be used in the pre-saturation compensation circuit 140 as compared to the post-CNC scaling circuit 142.

Figure 8:
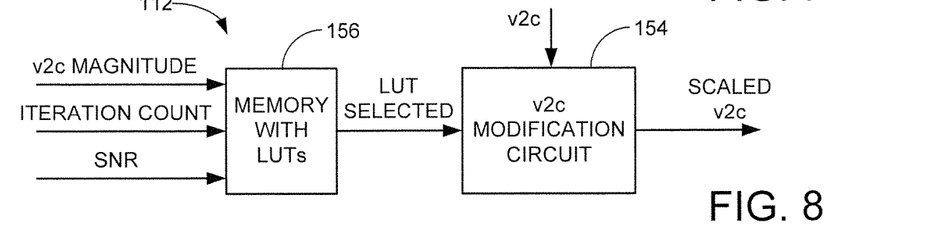
FIG. 8 illustrates another arrangement for the pre-saturation compensation circuit.

FIG. 8 shows another configuration for the pre-saturation compensation circuit 140. An LLR look-up table memory 156 stores one or more adaptive or empirically derived LUTs which are supplied to the v2c modification circuit 154 to generate scaled v2c messages (Sv2c). Every LLR LUT is a mapping function that maps input v2c messages represented with n-bits onto output scaled v2c (Sv2c) messages represented with p-bits. An example LLR LUT is provided in FIG. 9 assuming n=7 and p=4.

Figure 9:
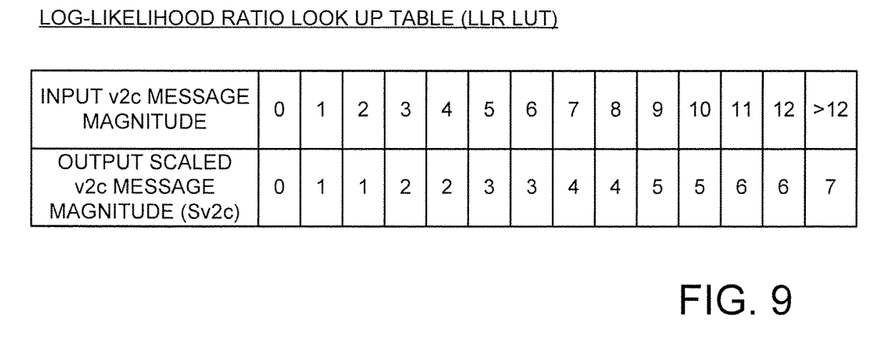
FIG. 9 represents an example of a log-likelihood ratio look-up table (LLR LUT) that describes a possible mapping of the messages in the LDPC decoder.

It can be seen from the table in FIG. 9 that the magnitude of the input messages is reduced at the output so that they are below the saturation limit that p=4 bits represent (e.g., 1111 base 2, or 15 base 10). At the same time, the scaled output messages Sv2c maintain useful information content much better than simply applying saturation to the v2c messages.

The LLR LUT memory 156 may monitor certain process parameters, such as v2c magnitude, iteration count in a given decoding sequence, SNR, etc. to switch in and apply different LLR LUTs. In at least some embodiments, different LUTs are applied at different iterations within a given LDPC decoding operation. A first LUT may be applied during a first iteration, a different, second LUT may be applied during a second iteration, and so on.

The various forms of pre-saturation compensation and post CNC scaling provided by the respective diagrams of FIGS. 7 and 8 are not mutually exclusive. Rather, both circuits can be employed by the LDPC decoder 112. In further embodiments, the pre-saturation compensation and post-CNC scaling techniques disclosed herein can be combined with other input LLR dampening methods.

In each case, the magnitudes of the compensated v2c messages will tend to be different for each message based on the magnitudes of the corresponding, uncompensated v2c messages (or the messages that would have been generated using the non-compensated LLR). Hence, the compensation does not truncate the messages at some predetermined level so that all messages beyond a certain magnitude are trimmed to the same maximum value. Instead, the compensation combines the underlying terms making up each message with one or more reducing values so that a reduction in scale is achieved while retaining the existing variability from one message to the next.

Figure 10:
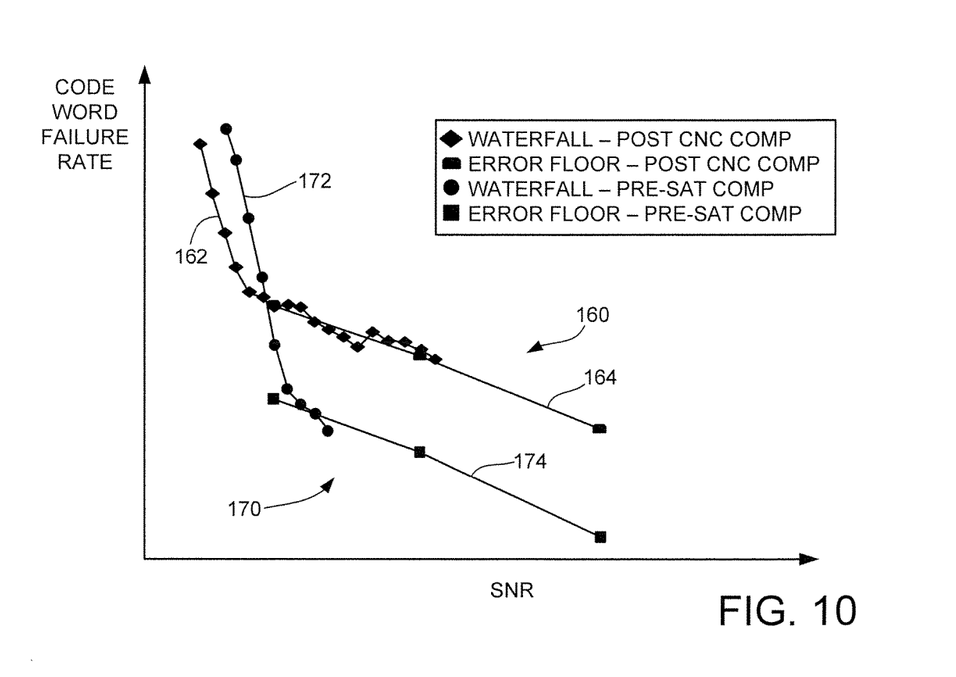
FIG. 10 is a graphical representation of exemplary improvements obtained by the application of pre-saturation compensation techniques as disclosed by some embodiments.

FIG. 10 provides a graphical illustration representative of data obtained from a particular data channel having a min-sum LDPC decoder as discussed above. A post CNC compensated curve 160 and a pre-saturation compensated curve 170 are each plotted against a code word failure rate x-axis and a signal to noise (SNR) y-axis. The post CNC compensated 160 describes error rate performance for an LDPC decoder with one type of post-CNC compensation involving the application of scaling and bias to the c2v messages. The pre-saturation compensated curve 170 describes error rate performance of an LDPC decoder with pre-saturation compensation involving the application of scaling and bias factors to the v2c messages.

Waterfall and error floor regions in curve 160 are denoted at 162 and 164, respectively. Waterfall and error floor regions in curve 170 are denoted at 172 and 174, respectively. Enhanced waterfall performance is achieved using the post-CNC compensation scheme, and a lower error floor is achieved using the pre-saturation compensation scheme. It has been found that similar enhancements in performance can be obtained in a variety of applications, and suitable scaling and bias factors can be derived by testing multiple sets of factors and observing results similar to those set forth in FIG. 10.

Figure 11:
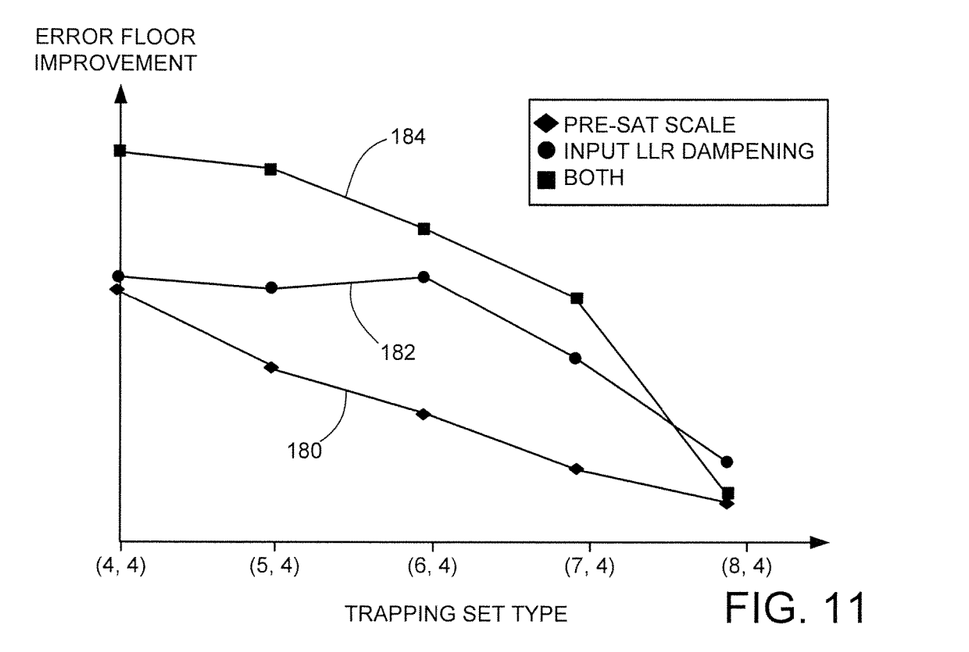
FIG. 11 is a graphical representation of exemplary error floor improvements for different trapping set types obtained by various embodiments.

FIG. 11 shows another graphical representation of a set of curves that indicate improvement in error floor performance. The curves are plotted against an x-axis that depicts several common types of trapping set types using (a, b) notation, with a representing a number of bit errors and b representing a number of unsatisfied parity constraints. The y-axis indicates contribution of a particular trapping set percentage contribution to improvement in the error floor, so that higher values indicate better performance. Layered decoding was applied with a maximum iteration count of 100.

Three curves are plotted in FIG. 11. Curve 180 represents the application of pre-saturation scaling for all iterations. Curve 182 shows application of input LLR dampening. Curve 184 shows the combination of the application of both of these techniques. As can be seen, both scaling factors and LLR dampening contributed to improvements, but both together provided significantly better performance for all listed trapping sets except for the set (8, 4), and even for that set the combination of the two techniques provided better performance than the pre-saturation scaling alone.

Figure 12:
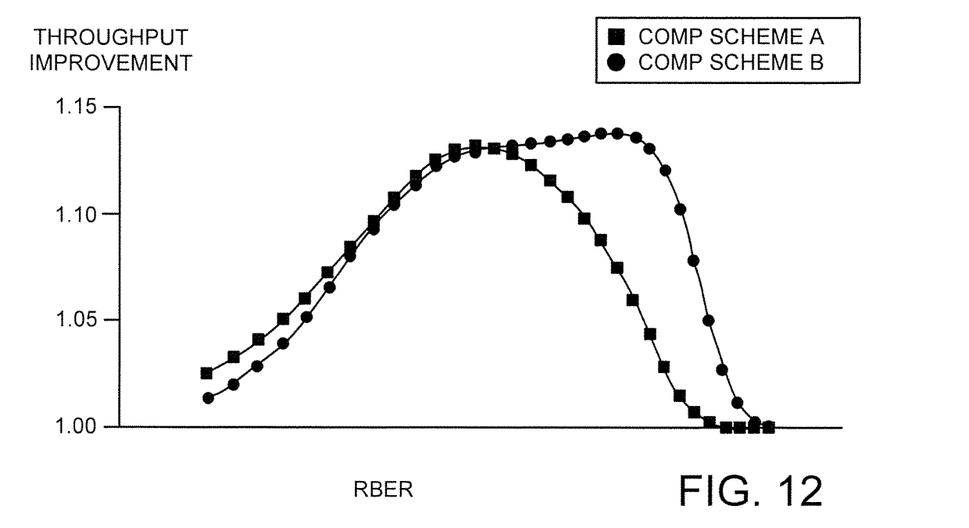
FIG. 12 is a graphical representation of exemplary throughput improvements for different embodiments.

FIG. 12 shows yet another graphical representation to illustrate enhancements obtained using the various embodiments presented herein. FIG. 12 evaluates throughput improvements in terms of higher overall data I/O rates achieved through faster and more successful decoding operations. Curve 190 indicates a first compensation scheme (Scheme A) and curve 192 indicates a different, second compensation scheme (Scheme B).

The respective curves 190, 192 are plotted against a raw bit error rate (RBER) x-axis and a normalized y-axis. The point 1.00 on the y-axis represents normal uncompensated baseline performance. Improvements in the vertical direction indicate percentage improvement over the baseline (e.g., point 1.05 on the y-axis indicates 5% improvement in throughput rate, etc.). In the results shown in FIG. 12, pre-saturation and post-CNC compensation are used. Scheme A (curve 190) and Scheme B (curve 192) apply two different iteration dependent scaling and bias schemes to both v2c and c2v messages.

Figure 13:
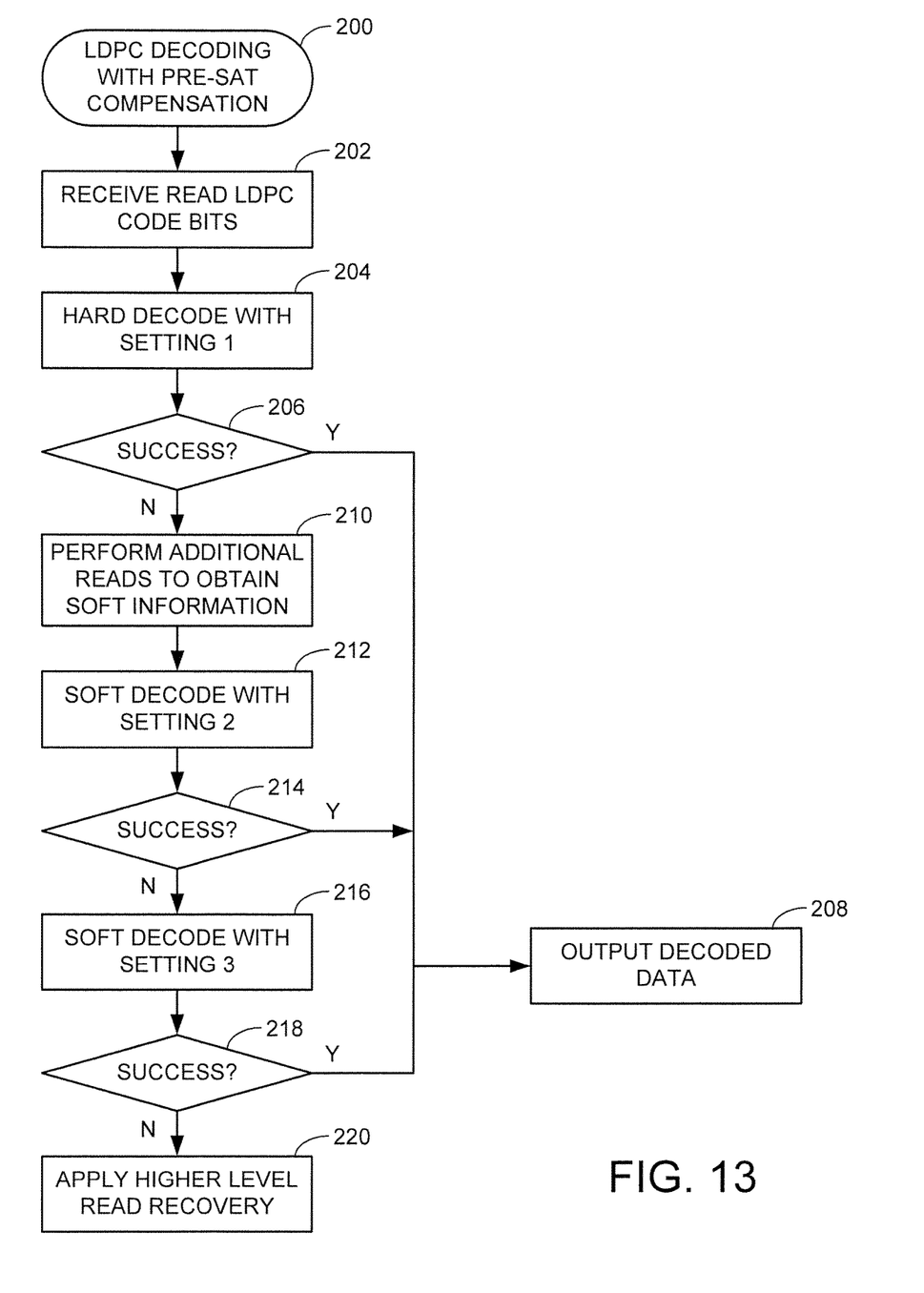
FIG. 13 is a flow chart illustrating operations carried out in accordance with some embodiments.

FIG. 13 provides a flow chart for an LDPC decoding with pre-saturation compensation routine 200 to set forth various steps carried out in accordance with the previous discussion. It is contemplated that the steps are carried out in the context of the data storage device 100 of FIG. 1 using the channel 110 of FIG. 2.

A read operation is carried out at step 202 to retrieve data from a non-volatile memory of the data storage device. Processing of the retrieved data includes generation of an initial code word (read LDPC code bits) by the detector 114, which are presented to the LDPC decoder 112 to identify any bit errors in the code bits.

An initial hard decode operation is carried out by the LDPC decoder 112 at step 204. This may involve a simple parity check of the v2c messages at the check nodes based on the initial bit values of the code bits, as discussed above in FIG. 4. Step 204 indicates that the hard decode is carried out using Setting 1 for the LDPC decoder; this may include parameter adjustments such scale/bias or LLR LUT mapping of v2c or c2v messages.

Decision step 206 determines whether the hard decode operation of step 204 was successful; if so, the flow passes to step 208 where the successfully decoded data are output for further processing.

If the hard decode operation was unsuccessful, the flow passes from decision step 206 to step 210 where one or more additional read operations are carried out to obtain soft information to aid in the decoding process. These additional read operations may involve adjustments in read voltage thresholds or other parametric changes to the memory.

A second decoding attempt of the LDPC decoder 112 is performed at step 212, using a soft decode operation. This may include the LLR values of FIGS. 5-6 being incorporated into the determination of the v2c messages from the additional reads of step 210. Step 212 shows that the LDPC decoder is configured using Setting 2, which may correspond to a different set of parameters to provide another pre-saturation and post-CNU scaling scheme.

Decision step 214 determines whether the second decoding attempt successfully resolved the remaining bit errors in the code bits. If not, the flow continues to step 216 where another soft decode operation is carried out using Setting 3, which is yet another parametric configuration different from Setting 2 of block 212. Furthermore, changing decoder setting for the next decoding attempt, in addition to scaling, bias and LLR LUT, may involve other decoder parameters as well, e.g., maximum number of iterations, input LLR dampening, etc.

The flow continues to decision step 218 which determines whether the errors have been resolved; if not, the flow passes to step 220 where higher levels of read recovery techniques are applied to continue to resolve the bit errors. Such higher levels can include read retries, adjustments to various read parameters, use of higher levels of outercode, etc. While only three decoding attempts are depicted in FIG. 13, it will be recognized that any number of attempts can be utilized as required before transitioning to other read recovery techniques.

Figure 14:
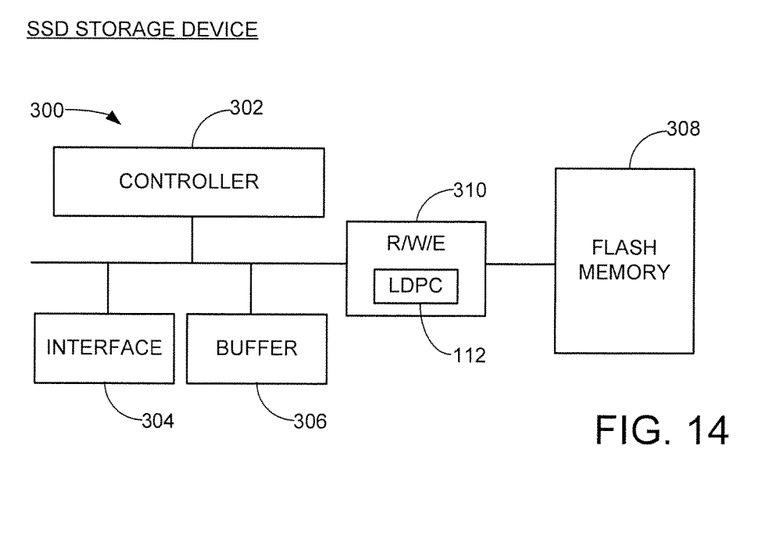
FIG. 14 is a functional block diagram of a solid state drive (SSD) type data storage device in which various embodiments may be advantageously practiced.
Figure 15:
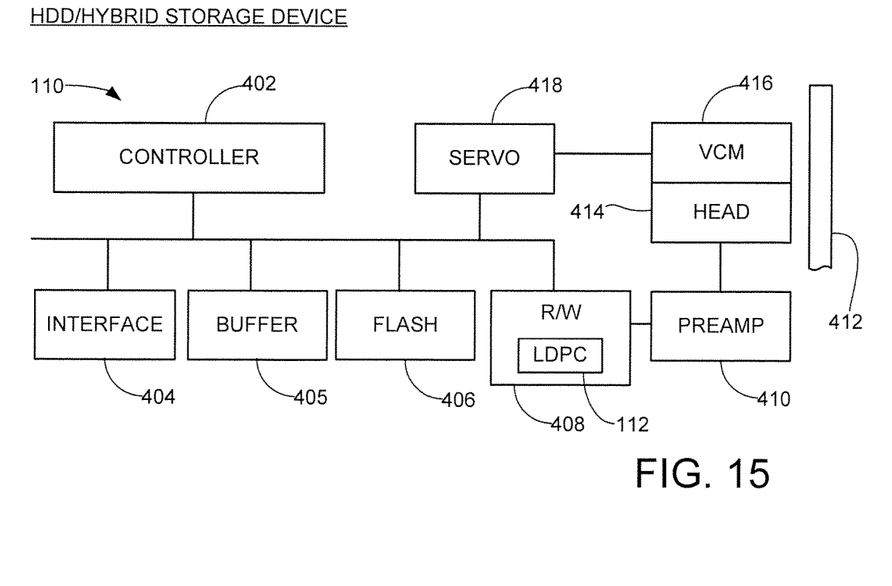
FIG. 15 is a functional block diagram of a hard disc drive (HDD) or hybrid type data storage device in which various embodiments may be advantageously practiced.

FIGS. 14 and 15 have been provided to illustrate further details regarding suitable environments for the use of the LDPC decoder 112 discussed herein. FIG. 14 shows a functional block diagram for a solid state drive (SSD) data storage device 300 in accordance with some embodiments.

A controller circuit 302 provides top level control for the device 300 and may correspond to the controller 102 of FIG. 1. An interface circuit 304 and local buffer memory 306 coordinate the transfer of user data between an external host device and a flash memory 308. A read/write/erase circuit 310 performs the requisite encoding of input write data and directs the programming of the appropriate flash memory cells to write the encoded write data to the memory 308. During a read operation, the programmed data bits are recovered and subjected to processing by the LDPC decoder 112 (which forms a portion of the R/W/E circuit 310) prior to transfer of the originally supplied data to the host.

FIG. 15 provides a functional block diagram for a hard disc drive (HDD) or hybrid solid state drive (HSSD) storage device 400 in some embodiments. A controller circuit 402, interface circuit 404 and buffer memory 405 operate as in FIG. 14 to coordinate data transfers with a host device. A flash memory 406 provides local non-volatile semiconductor memory for storage of data. A read/write (R/W) channel 408 and preamplifier/driver (preamp) 410 support transfers of data to a rotatable recording medium (disc) 412 using a data read/write transducer (head) 414. Head position is controlled using a voice coil motor (VCM) 416 and a closed loop servo control circuit 418.

Data from the host may be stored to the flash 406 and/or the disc 412 as required. As before, the channel 408 encodes the data during a write operation, and uses LDPC processing to recover the data during a subsequent read operation. Separate LDPC decoders 112 may be used as required for the decoding of the data stored to the flash and disc.

It will now be appreciated that the various embodiments presented herein provide a number of benefits over the existing art. The use of pre-saturation compensation and post-CNU scaling can provide significant improvements in waterfall and error floor performance.

It is contemplated although not required that the initial decode operation by the LDPC decoder will be a hard decode and the scaling/bias factors and/or LUT mapping and/or LLR dampening values will be set to provide the best possible code word failure rate at the lowest SNR value. If throughput is the dominant requirement, the scaling/bias factors and/or LUT mapping/LLR dampening values can be set to achieve the required throughput rate while minimizing code word failure rate to the extent practical.

Subsequent decoding attempts are contemplated as constituting soft decodes based on read retries where the data are reread using different read parameters (e.g., different read voltage thresholds, different head fly heights, etc.) to provide soft information that can be incorporated into the soft decode operation. Different scaling/bias factors and/or LLR dampening values can be utilized to provide the best code word failure rate at the lowest SNR for the soft decode operation. Two or more sets of scaling/bias/LLR dampening values can be switched in for different iterations. As noted above, these techniques can achieve significant improvements in error floor performance, in some cases orders of magnitude better than non-compensated solutions.

It is to be understood that even though numerous characteristics and advantages of various embodiments of the present disclosure have been set forth in the foregoing description, together with details of the structure and function of various thereof, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. A low density parity check (LDPC) decoder, comprising:
  a variable node circuit (VNC) comprising a plurality of variable nodes configured to generate first multi-bit messages based on code bit reliability values of an input code word from a data communication channel comprising user data bits and redundant bits;
  a pre-saturation compensation circuit configured to apply a first reducing factor to the first multi-bit messages to generate first scaled multi-bit messages to maintain the first multi-bit messages below a predetermined saturation limit;
  a check node circuit (CNC) comprising a plurality of check nodes configured to perform parity check operations upon the first scaled multi-bit messages to generate second multi-bit messages responsive to the parity check operations; and
  a post-CNC scaling circuit configured to reduce a magnitude of each of the second multi-bit messages responsive to a different, second reducing factor to generate second scaled multi-bit messages which are forwarded to the VNC.

2. The LDPC decoder of claim 1, wherein different first and second reducing factors are applied during each of at least two iterations of transfers of the respective first and second scaled multi-bit messages between the VNC and the CNC during a decoding operation to resolve bit errors in the input code word.

3. The LDPC decoder of claim 1, wherein the first reducing value comprises a scaling factor that is multiplied with each first multi-bit message to generate each corresponding first scaled multi-bit message.

4. The LDPC decoder of claim 1, wherein the first reducing value comprises a bias factor that is added to each first multi-bit message to generate each corresponding first scaled multi-bit message.

5. The LDPC decoder of claim 1, wherein each of the first scaled multi-bit messages received by the CNC has a different magnitude during a selected decoding attempt by the LDPC decoder.

6. The LDPC decoder of claim 1, wherein the pre-saturation compensation circuit comprises a look up table in a memory that uses the first reducing factor to output different magnitudes for the first scaled multi-bit messages responsive to receipt of different magnitudes of first multi-bit messages.

7. The LDPC decoder of claim 1, wherein each of the first scaled multi-bit messages has a different magnitude in relation to an initial magnitude of the associated first multi-bit message.

8. The LDPC decoder of claim 1, wherein the first multi-bit messages are n-bit messages and the first scaled multi-bit messages are p-bit messages where p<n and wherein the predetermined saturation limit comprises a maximum value that can be expressed using p bits.

9. The LDPC decoder of claim 1, further comprising a local memory configured to store partial posterior information associated with a prior iteration of the LDPC decoder, the first multi-bit messages further comprising the partial posterior information during a subsequent iteration of the LDPC decoder.

10. The LDPC decoder of claim 1, in combination with a channel circuit of a data storage device comprising a main memory, wherein the m-bit code words comprise data retrieved from the main memory during a read operation to transfer user data to a host device coupled to the data storage device.

11. A data storage device, comprising:
  a controller circuit;
  a main memory configured to store user data supplied by a host device; and
  a channel circuit configured to retrieve previously stored user data arranged as code words from the main memory, the channel circuit comprising a detector circuit and a low density parity check (LDPC) decoder, the LDPC decoder comprising:

a variable node circuit (VNC) comprising a plurality of variable nodes configured to generate variable-to-check (v2c) messages based on bit reliability values of a selected retrieved code word having m-code bits responsive to an input from the detector circuit, each v2c message having n-bits;

a pre-saturation compensation circuit configured to generate scaled v2c messages by using a selected reducing factor to decrease a magnitude of each v2c message below the maximum value that can be expressed using p bits to lower an error floor response of the LDPC decoder where p is less than n;

a check node circuit (CNC) comprising a plurality of check nodes configured to perform parity check operations upon the scaled v2c messages to generate check-to-variable (c2v) messages, each of the c2v messages having p-bits, the transfer of the v2c messages followed by the transfer of the c2v messages comprising one decoding iteration by the LDPC decoder, the pre-saturation compensation circuit using a first reducing factor during a first decoding iteration and a different, second reducing factor during a second decoding iteration, each of the first and second decoding iterations comprising the transfer of a set of the scaled v2c messages and a corresponding set of the c2v messages.

12. The data storage device of claim 11, wherein the LDPC decoder further comprises a post-CNC scaling circuit configured to reduce a magnitude of each of the c2v messages responsive to a reducing factor to enhance a waterfall region response of the LDPC decoder.

13. The data storage device of claim 11, wherein the pre-saturation compensation circuit comprises a look up table in a memory that outputs the scaled v2c messages responsive to receipt of different input v2c messages generated by the VNC, each scaled v2c message output by the look up table having a reduced magnitude as compared to the corresponding v2c message input to the look up table.

14. The data storage device of claim 11, wherein the pre-saturation compensation circuit uses at least a selected one of a first scaling factor or a first bias factor to generate a first v2c message for a selected check node during the first iteration, and at least a selected one of a different second scaling factor or a different second bias factor to generate a second v2c message for the selected check node during the second iteration.

15. The data storage device of claim 11, wherein the channel circuit recovers the code word from a selected location in the main memory responsive to a read command supplied by the controller circuit in which a first set of parameter values is used, and wherein, responsive to detection of an unrecoverable error during a first decoding attempt, the channel circuit obtains soft information by recovering additional information for the code word using a second set of parameter values, the soft information incorporated into a subsequent v2c message compensated by the pre-saturation compensation circuit during a second decoding attempt.

16. A method for decoding a code word from a communication channel, the method comprising:

receiving, by a variable node circuit (VNC), an input code word, the VNC comprising a plurality of variable nodes configured to generate bit reliability values;

generating a plurality of variable-to-check (v2c) messages, each v2c message having n-bits and formed from a combination of the bit reliability values stored in a memory of CNC messages;

conditioning each of the v2c messages to generate conditioned v2c messages to maintain a magnitude of the conditioned v2c messages below a saturation limit comprising the maximum value that can be expressed using p bits where p is less than n by applying a first reducing factor to each of the v2c messages;

performing parity check operations by a check node circuit (CNC) upon the conditioned v2c messages, the CNC comprising a plurality of check nodes respectively coupled to the different subsets of the variable nodes;

outputting a plurality of check-to-variable (c2v) messages responsive to the parity check operations;

combining the c2v messages with a different second reducing factor to generate a corresponding plurality of reduced magnitude c2v messages; and repeating the generating, conditioning, performing and outputting steps a plural number of iterations to correct all errors in the input code word.

17. The method of claim 16, further comprising forwarding the reduced magnitude c2v messages to a memory configured to supply the reduced magnitude c2v messages to the VNC during a subsequent iteration.

18. The method of claim 16, wherein the conditioning step comprises receiving a message having a first magnitude, using a look up table in a memory to output a compensated message having a second magnitude less than the first magnitude, and transmitting the compensated message to the CNC.

19. The method of claim 16, further comprising storing partial posterior information in a local memory and using the partial posterior information to generate the v2c messages.

* * * * *